United States Patent [19]
Schneider

[11] Patent Number: 5,796,049
[45] Date of Patent: Aug. 18, 1998

[54] ELECTRONICS MOUNTING PLATE WITH HEAT EXCHANGER AND METHOD FOR MANUFACTURING SAME

[75] Inventor: Michael G. Schneider, Rockford, Ill.

[73] Assignee: Sundstrand Corporation, Rockford, Ill.

[21] Appl. No.: 832,998

[22] Filed: Apr. 4, 1997

[51] Int. Cl.$^6$ ............................................. H05K 1/00
[52] U.S. Cl. ............................... 174/252; 361/705
[58] Field of Search .................................. 361/704, 705, 361/707, 708, 709, 710, 717, 718, 719, 720, 721; 174/252, 250, 257, 260, 258; 257/706, 707, 722

[56] References Cited

U.S. PATENT DOCUMENTS

| | | |
|---|---|---|
| 4,009,423 | 2/1977 | Wilson . |
| 4,625,095 | 11/1986 | Das ............................ 219/137 WM |
| 4,672,164 | 6/1987 | Devletian ........................ 219/96 |
| 4,978,054 | 12/1990 | Ferrando et al. ................ 228/194 |
| 4,995,451 | 2/1991 | Hamburgen . |
| 5,111,280 | 5/1992 | Iversen . |
| 5,133,494 | 7/1992 | Wang et al. . |
| 5,168,348 | 12/1992 | Chu et al. . |
| 5,203,488 | 4/1993 | Wang et al. . |
| 5,365,108 | 11/1994 | Anderson et al. . |
| 5,400,947 | 3/1995 | Wang et al. . |
| 5,402,004 | 3/1995 | Ozmat . |
| 5,455,118 | 10/1995 | Cook ............................... 428/555 |
| 5,533,257 | 7/1996 | Romero et al. . |

*Primary Examiner*—Bot L. Ledynh
*Assistant Examiner*—Kristina Soderquist
*Attorney, Agent, or Firm*—Leydig, Voit & Mayer, Ltd.

[57] ABSTRACT

A combined electronics mounting plate and heat exchanger and method of manufacturing same. The present invention provides an electronics mounting plate formed from a metal matrix composite and a metal heat exchanger in order to combine the low coefficient of thermal expansion and high heat dissipation characteristics of a metal matrix composite, with the cost effectiveness and relatively easy manufacturability of metal. In the preferred embodiment, the metal matrix composite is provided in the form of aluminum and silicon carbide, and the metal heat exchanger is provided in the form of aluminum fins. The method of manufacturing the present invention includes the steps of cleaning the metal matrix composite mounting plate and aluminum heat exchanger in a nitric acid fluoride salt before brazing the elements together. In one embodiment of the present invention the metal matrix composite mounting plate includes pin fins extending toward the aluminum heat exchanger fins, and an additional aluminum braze sheet is provided between the mounting plate and heat exchanger fins to enhance the brazement therebetween and improve the thermal conductivity of the resulting mounting plate and heat exchanger.

6 Claims, 1 Drawing Sheet

ELECTRONICS MOUNTING PLATE WITH HEAT EXCHANGER AND METHOD FOR MANUFACTURING SAME

TECHNICAL FIELD

The present invention generally relates to the substrates for mounting electronic components thereon, and more particularly relates to electronics mounting plates having heat exchanger capabilities formed integrally therewith.

BACKGROUND

Modern electronics are often comprised of a plurality of individual components mounted onto a substrate and electrically interconnected for operation of a controlled device. Thousands of electronically controlled applications are currently in existence, and although the present invention is primarily designed for use on aircraft, it is to be understood that the principles, devices and methods disclosed herein could be employed with other electronic applications with equal success.

The electronic components involved, such as power supplies, IGBTs, transistors, and other power switching components, are generally referred to as power devices. Such power devices consume large amounts of energy and consequently generate large amounts of heat. If the heat is not properly dissipated, the efficacy of the electronic components will necessarily suffer and the controlled device can potentially fail. Since one application of the present invention is for use onboard modern aircraft, failure of the electronic controls of the aircraft could prove disastrous. Proper heat dissipation is therefore of an utmost concern.

The substrates used are normally selected to maximize heat dissipation for the reasons indicated above, while minimizing cost. Metals, such as aluminum, can be used because they can be relatively easily formed into fins and other intricate heat exchanging structures at relatively low cost, and are particularly good conductors of heat. However, metals such as aluminum have relatively poor coefficients of thermal expansion, and therefore tend not to maintain their shape at elevated temperatures. On the other hand, the semiconductor devices mounted to the substrate typically have very low coefficients of thermal expansion, and thus when subjected to high operaturing temperatures, relative movement betwen the semiconductor devices and the metal substrate causes the semiconductor devices to become disconnected or otherwise damaged.

In recent years, therefore, new materials have been employed to provide high levels of thermal conductivity, while also providing low coefficients of thermal expansion to thereby maintain the structural integrity of the unit even at high operating temperatures. This area of the art has greatly benefitted from the advent of metal matrix composites (MMCs). MMCs are a mixture of metal and ceramic fibers which provide a material with high thermal conductivity at a low coefficient of thermal expansion. For example, a known MMC includes a porous matrix of silicon carbide which is then impregnated with aluminum. Semiconductor devices can then be mounted on the MMC, and since the MMC and the semiconductor devices have nearly identical coefficients of thermal expansion, little or no relative movement between the semiconductor devices and MMC occurs, even at the high operating temperatures of many applications.

While such materials do provide relatively high thermal conductivity and relatively low coefficients of thermal expansions, they come at a relatively high monetary expense. Moreover, if it is often difficult and therefore additionally expensive to form intricate heat dissipating shapes, such as lanced, offset fins and the like, from the MMC. This results from the fact tat MMCs are typically cast or hot iso-statically processed into form, and as such typically have a high modulus of elasticity, making them unsuitable for cold-working into intricate heat exchanging shapes.

The relevant industry has therefore attempted to merge the heat dissipation and thermal expansion benefits of MMC technology, with the cost effectiveness, structural integrity and malleability of conventional metals to form a combined electronics mounting plate and heat exchanger. For example, U.S. Pat. No. 5,533,257, discloses a method for forming a heat dissipation apparatus formed from an MMC mounting plate and aluminum heat exchanger fins. While such an apparatus touches upon the benefits of a metal/MMC combination, it employs an epoxy to bond the aluminum fins to the MMC mounting plate. The thermal conductivity between the mounting plate and heat exchanger fins therefore suffers as a result of the relatively low thermal conductivity of the epoxy. Moreover, such a bonding epoxy severely curtails the shape of the heat exchanger surface which can be bonded to the MMC mounting plate due to the relatively high amount of surface area required from both the heat exchanger element and MMC mounting plate in order to provide a sufficiently strong bond. The harsh vibrational environment of an aircraft requires greater structural integrity than the epoxy can sometimes provide.

Other attempts have been made to provide more intricate heat exchanger shapes with enhanced structural integrity. For example, U.S. Pat. No. 5,402,004 discloses a MMC mounting plate with which an aluminum sponge, similar to "steel wool", is in thermal communication. In one embodiment, the MMC plate has an aluminum layer formed thereon by ion vapor deposition. A layer of aluminum/silicon alloy is then disposed on the aluminum layer, and the sponge is then brazed to the aluminum/silicon alloy. While such a system may adequately dissipate the heat generated by its electronic components, a fluid coolant is required to pass through the sponge given the relatively small cross-sectional size of each strand of the "steel wool". Considering the huge heat dissipation demands of aircraft electronics, such a system cannot be sized to operate effectively under the present application. Moreover, its complex, multilayered attachment method substantially negates the cost benefit of using aluminum as a heat exchanger in the first place.

SUMMARY

It is therefore a primary aim of the present invention to provide a combined electronics mounting plate and heat exchanger which provides high heat dissipation with low thermal expansion in a cost-effective package.

It is an objective of the present invention to provide a combined electronics mounting plate and heat exchanger which provides the aforementioned heat dissipation, thermal expansion and cost benefits while providing high structural integrity adapted to withstand the harsh environmental conditions of modern aircraft.

It is another objective of the present invention to provide a method for attaching the mounting plate to the heat exchanger which maintains the heat dissipation, thermal expansion, structural integrity and cost benefits indicated above, while enabling a wide range of actual heat exchanger shapes and elements to be reliably secured together and thereby enhance the manufacturability of the device.

In accordance with these objectives, it is a feature of the present invention to provide a combination electronics mounting plate and heat exchanger in the form of a metal matrix composite mounting plate and an aluminum heat exchanger. The mounting plate is provided with a first planar surface adapted to have electronic components mounted thereon, and a second, opposed, planar surface adapted to be joined to the aluminum heat exchanger. The aluminum heat exchanger, in one embodiment, is provided with a plurality of fins which are brazed to the second planar surface of the mounting plate.

It is another feature of the present invention to provide a combination electronics mounting plate and heat exchanger wherein the mounting plate is formed from an aluminum and silicon carbide metal matrix composite, and the aluminum heat exchanger fins are brazed to the metal matrix composite mounting plate. In one embodiment of the present invention, the metal matrix composite includes a plurality of pins extending from the second planar side in order to increase the surface area available for thermal conduction and heat dissipatoin.

It is another feature of the present invention to provide a combination electronics mounting plate and heat exchanger including a metal matrix composite mounting plate having a plurality of pin fins mounted integrally therewith and a plurality of aluminum heat exchanger fins brazed to the plurality of pin fins. Alternatively, the pin fins could be brazed to one side of an aluminum plate, and a plurality of aluminum fins could be brazed to the opposite side of the aluminum plate.

It is still another feature of the present invention to provide a method for manufacturing a combination electronics mounting plate and heat exchanger wherein the mounting plate is formed from an aluminum and silicon carbide metal matrix composite and the heat exchanger is formed from aluminum. The method includes the steps of cleaning the metal matrix composite mounting plate and aluminum heat exchanger in a nitric acid fluoride salt bath before brazing the elements together.

It is a still further feature of the present invention to provide a method for manufacturing a combination electronics mounting plate and heat exchanger wherein the mounting plate and heat exchanger are cleaned in nitric acid salt bath less than twenty-four (24) hours prior to the brazing step. In an alternative embodiment, the method further includes the step of brazing the mounting plate to the heat exchanger when the elements are within an approximate temperature range of between 1070–1080 F.°. Moreover, the method can further include the step of using an additional braze foil or paste between the metal matrix composite mounting plate and aluminum heat exchanger to further enhance the structural integrity and thermal conductivity of the resulting mounting plate and heat exchanger.

These and other objectives and features will be most completely and beneficially understood as explained in the following detailed description when read and comprehended in conjunction with the accompanying drawings.

While the present invention is described below with reference to certain preferred embodiments, it is to be understood that such embodiments are chosen for the express purpose of disclosing the best mode of the present invention, and should in no way be construed to limit the scope of the invention to such specifically disclosed embodiments. Rather, the present invention is intended to cover all embodiments of the present invention as specifically described herein, reasonably taught thereby, and falling within the scope of the claims appended hereto.

DESCRIPTION OF THE INVENTION

Figure 1:
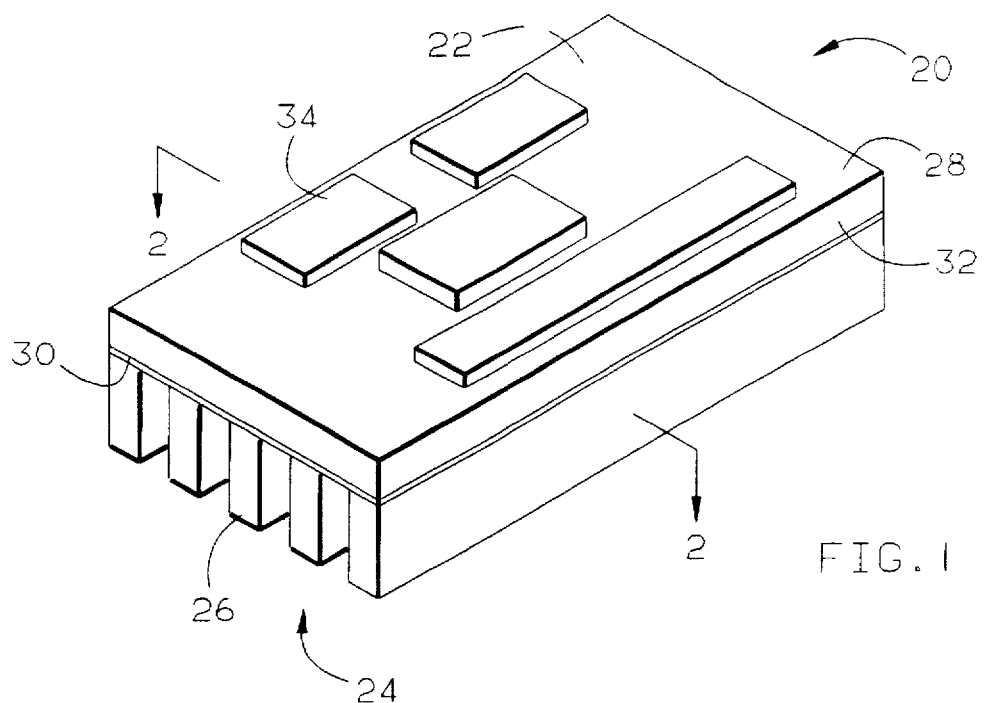
FIG. 1 is a perspective view of the present invention.

Referring now to FIG. 1, the present invention is generally designated as combined electronics mounting plate and heat exchanger 20. As stated above, the present invention does not endeavor to claim the broad concept of combining a metal matrix composite mounting plate for electronics with an aluminum heat exchanger. The prior art shows that such devices exist. However, what the prior art lacks, and what the present invention provides, is a combination metal matrix composite mounting plate and heat exchanger wherein the heat exchanger includes a plurality of individual fins brazed to the metal matrix composite. Moreover, the present invention provides a method for manufacturing a combination electronics mounting plate and heat exchanger which enables a variety of heat exchanger shapes and structures to be reliably secured to the mounting plate and which are sized to dissipate the large amounts of heat generated by the type of aircraft electronics to which the present invention is directed.

As shown in FIG. 1, combination mounting plate and heat exchanger 20 includes a planar mounting plate 22 joined to heat exchanger 24 in the form of a plurality of individual fins 26. In the embodiment shown in FIGS. 1 and 2, mounting plate 22 includes first planar side 28, second opposed planar side 30, and four orthogonally disposed sides 32. It is to be understood that in alternative embodiments, the actual shape of plate 22 could vary greatly, and that the import of plate 22 is that it is formed form a metal matrix composite having one side adapted to have electronic components mounted thereon, and another side adapted to be brazed to a heat exchanger. In the preferred embodiment, first planar side 28 is adapted to have electronic components 34 mounted thereon. Any type of electronic component is envisioned as being mountable to plate 22, including transistors, processing chips, memory chips, IGBTs, power modules, and the like.

Similarly, heat exchanger 24 is adapted to formed in any number of different shapes and configurations for augmenting the surface area over which the heat generated by components 34 is communicated and dissipated. With that being said as a preface, heat exchanger 24 is shown as being comprised of a plurality of fins 26 extending away from second planar surface 30 of mounting plate 22. It is to be understood that a variety of other shapes including offset or lanced fins could be used with equal efficacy assuming the fins are sized adequately to dissipate the sizable heat output of components 34. Moreover, the present invention could also include the provision of a liquid coolant circuit which would pass between fins 26 for added cooling capacity.

Figure 2:
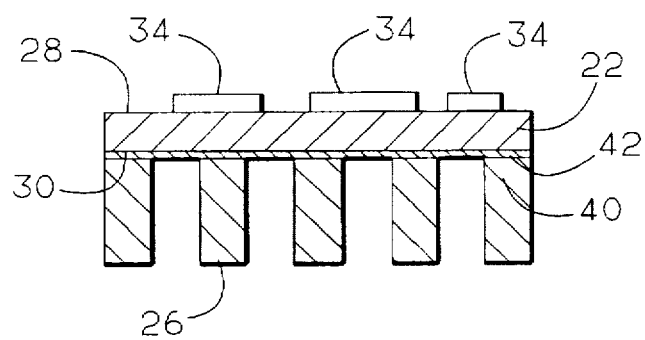
FIG. 2 is sectional view of the embodiment of the present invention shown in FIG. 1 taken along line 2—2.

Turning now with specific reference to FIG. 2, the present invention is shown in cross-section to more effectively depict the structure and formation of the combined electronics mounting plate and heat exchanger 20. As shown therein, second planar surface 30 of mounting plate 22 is brazed to ends 40 of heat exchanger fins 26. In order to effect this braze a thin metal skin 42 is formed on second planar surface 30, which, in the preferred embodiment, is formed from aluminum. Fins 26 are then brazed to skin 42 according to the method of the present invention, which method will be described in greater detail herein. In the preferred embodiment skin 42 has a thickness within the range of 0.001 to 0.006 inches and an average thickness of 0.004 inches. Also in the preferred embodiment, the metal matrix composite is composed of 6061 or 356 aluminum matrix with 68 percent SiC particulate reinforcement.

For the sake of clarity, it is important to understand at this point of the disclosure that the present invention as now described diverges from, and improves upon, the prior art by brazing aluminum fins 26 directly to an aluminum/silicon carbide metal matrix composite mounting plate 22. By doing so, the present invention provides a mounting plate 22 with a low coefficient of thermal expansion which will allow the plate 22 to maintain its shape and not allow components 34 to migrate from their proper position and alignment even when subjected to high operating temperatures. Moreover, the present invention provides high heat dissipation capabilities due to the large amount of surface area provided by fins 26, high structural integrity due to the use of brazing for the attachment method, and a multitude of heat exchanger shapes given the relatively easy manufacturability and malleable nature of aluminum.

Figure 3:
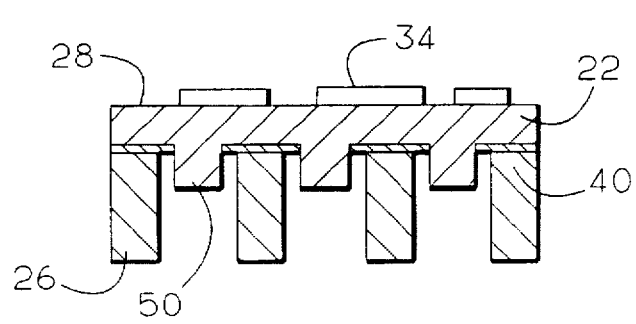
FIG. 3 is a sectional view of an alternative embodiment of the present invention showing pins fins integrally formed with the metal matrix composite mounting plate, and an additional braze sheet disposed between the mounting plate and the heat exchanger.

In an alternative embodiment of the present invention, shown in FIG. 3, mounting plate 22 is formed with a plurality of pin fins 50, which can be economically manufactured on an MMC plate and formed integrally with second planar side 30. Pin fins 22 extend toward aluminum fins 50 to provide an even more structurally sound brazement with enhanced heat conductivity and dissipation. Alternatively, pin fins 22 could extend toward another aluminum or MMC plate to which additional fins could brazed.

In an alternative embodiment, an additional brazing sheet is provided between second planar surface 30 and aluminum fins 26. The brazing sheet can be provided in the form of a foil or paste. The additional brazing material is provided to enhance the thermal conductivity and communication between mounting plate 22 and heat exchanger 24, while further fortifying the structural integrity of the brazed joint therebetween.

The method by which the present invention is formed will now be described in detail. As stated, supra, mounting plate 22 is formed from aluminum and silicon carbide, while heat exchanger 24 is formed from aluminum. In the most basic form of the present invention, fins 26 are brazed to second planar surface 30, meaning the components are heated to a temperature which allows a brazing agent to melt and join the fins 26 to the second planar surface 30. In the preferred embodiment, additional steps and more specific parameters are followed to ensure proper formation of the brazement, while in alternative embodiments other methods of joining the elements together can be used effectively.

With reference to the preferred embodiment, the aforementioned additional steps include the step of chemically cleaning the mounting plate 22 and heat exchanger 24 prior to brazing. The specific parameters include the requirement that the cleaning step is performed in a nitric acid salt bath to thoroughly remove any particulates or impurities which would otherwise detrimentally affect the efficacy of the brazement. In the most preferred embodiment of the present invention, the elements are cleaned in the nitric acid salt bath less than twenty-four (24) hours before brazing to most effectively assure the contaminants are not only removed, but removed at the time of brazing. If manufacturing criterion dictate otherwise, however, the cleaning window can be extended for up to one hundred and twenty (120) hours if the elements are stored in sealed containers, such as plastic bags having reclosable strips, with a desiccant immediately after cleaning to assure condensate does not form on the elements.

The method of the present invention is further optimized if the brazing is performed when mounting plate 22 and heat exchanger 24 are within the temperature range of 1070–1080 F.°. In order to assure this temperature range, it may therefore be necessary to equip the furnace or kiln within which the elements are brazed with a kill or disable switch to prevent the temperature within the furnace from exceeding the aforementiond desired temperature range. If temperatures in excess of the stated range are used, excessive brazing material will be formed which will necessarily decrease the thermal conductivity between mounting plate 22 and heat exchanger 24.

In order to most effectively remove oxygen prior to brazing and immediately after brazing, the method of the present invention can further include the steps of adding nitrogen to the furnace or kiln when it is within a temperature range of approximately 500–600 F.° prior to brazing, and again adding nitrogen to the furnace or kiln when it is within a temperature range of approximately 1000–1050 F.° immediately after brazing. Furthermore, the method can include the step of adding magnesium powder or chips to the furnace to remove any remaining oxygen. It is desirable to remove all oxygen so as to prevent oxidation of the surfaces to be brazed together, which oxidation would detrimentally affect the integrity of the resulting brazement.

From the foregoing, it can be appreciated by one of ordinary skill in the art that the present invention brings to the art a new, useful, and non-obvious combination electronics mounting plate and heat exchanger and method for manufacturing such a device. By brazing an aluminum heat exchanger to an aluminum and silicon carbide mounting plate, the thermal expansion of the mounting plate is decreased, the heat dissipation capability of the heat exchanger is increased, the structural integrity of the combination is increased, and the cost of the combination is decreased. The present invention lies not only within the apparatus disclosed herein, but the method by which the apparatus is manufacuted. Prior art devices fully fail to disclose, suggest, teach, or provide a compelling motivation to create such an invention as described above and claimed below.

While the invention has been described in terms of its preferred embodiment, it should be understood that numerous modifications may be made thereto without departing from the spirit and scope of the present invention. It is intended that the present invention should include not only the specific embodiments disclosed, supra, but also any embodiments equivalent thereto, reasonably taught thereby, or falling within the scope of the appended claims.

We claim:

1. A combination electronics mounting plate and heat exchanger, comprising:

a substrate made of metal matrix composite having a first planar surface and a second, opposed planar surface, the first planar surface having electronic components mounted directly thereon, the substrate including a plurality of pin fins integrally formed therewith, and extending from, the second planar surface to increase the total surface area and enhance the thermal conductivity and heat dissipation of the substrate; and a heat exchanger having a plurality of fins brazed directly to the second, opposed planar surface of the substrate, the plurality of heat exchanger fins being interposed between the substrate pin fins, the pin fins being laterally spaced from the heat exchanger fins to increase the surface area of the substrate and heat exchanger.

2. The combination electronics mounting plate and heat exchanger of claim 1 wherein the metal matrix composite is formed from aluminum and silicon carbide.

3. The combination electronics mounting plate and heat exchanger of claim 1 wherein the heat exchanger fins are formed from aluminum.

4. The combination electronic mounting plate and heat exchanger of claim 1 wherein a braze foil is disposed between the substrate and the heat exchanger fins.

5. The combination electronic mounting plate and heat exchanger of claim 1 wherein a braze paste is disposed between the substrate and the heat exchanger fins.

6. The combination electronics mounting plate and heat exchanger of claim 5 wherein the braze paste is formed from aluminum.

* * * * *